United States Patent [19]
Dobuzinsky et al.

[11] Patent Number: 5,173,452
[45] Date of Patent: Dec. 22, 1992

[54] PROCESS FOR THE VAPOR DEPOSITION OF POLYSILANES PHOTORESISTS

[76] Inventors: David M. Dobuzinsky, 26 Cascade St., Essex Junction, Vt. 05452; Mark C. Hakey, P.O. Box 212, Milton, Vt. 05468; Steven J. Holmes, 117 Morse Pl., Burlington, Vt. 05401; David V. Horak, 47 Briar La., Essex Junction, Vt. 05452

[21] Appl. No.: 635,819

[22] Filed: Jan. 2, 1991

Related U.S. Application Data

[63] Continuation of Ser. No. 311,326, Feb. 15, 1989, abandoned.

[51] Int. Cl.$^5$ .................. H01L 21/00; H01L 21/02; G03F 7/10
[52] U.S. Cl. .................. 437/229; 437/225; 437/228; 148/DIG. 137; 430/270
[58] Field of Search ............. 437/223, 225, 228, 229; 427/38, 109; 430/269, 270, 322, 326; 148/DIG. 137

[56] References Cited

U.S. PATENT DOCUMENTS

| | | | |
|---|---|---|---|
| 3,399,223 | 8/1968 | Atwell et al. | 260/448.8 |
| 4,298,558 | 11/1981 | Baney et al. | 264/65 |
| 4,348,473 | 9/1982 | Okumura et al. | 430/296 |
| 4,386,117 | 5/1983 | Gordon | 427/109 |
| 4,507,331 | 3/1985 | Hiraoka | 427/38 |
| 4,578,495 | 3/1986 | Soula et al. | 556/468 |
| 4,587,205 | 5/1986 | Harrah et al. | 430/326 |
| 4,588,801 | 5/1986 | Harrah et al. | 528/33 |
| 4,639,379 | 1/1987 | Asai et al. | 427/40 |
| 4,667,046 | 5/1987 | Frey et al. | 556/430 |
| 4,675,273 | 6/1987 | Woods et al. | 430/325 |
| 4,781,942 | 11/1988 | Leyden et al. | 427/54.1 |

FOREIGN PATENT DOCUMENTS 0136421 4/1985 European Pat. Off. .
0010535 1/1990 Japan .

OTHER PUBLICATIONS

West, R., "Polysilane High Polymers and Their Technological Applications", Actual. Chim., (3), 1986, pp. 64–70.

*Primary Examiner*—Brian E. Hearn
*Assistant Examiner*—B. Everhart
*Attorney, Agent, or Firm*—William D. Sabo

[57] ABSTRACT

Disclosed is a process for forming a film comprising a polysilane composition on a substrate. The film is formed by vapor deposition directly on a substrate, thus avoiding the cumbersome steps ordinarily encountered in preparing and applying polysilanes by conventional spin application techniques. The film is used in a lithographic process for forming an image on a substrate.

18 Claims, No Drawings

PROCESS FOR THE VAPOR DEPOSITION OF POLYSILANES PHOTORESISTS

This is a continuation of copending application Ser. No. 07/311,326 filed on Feb. 15, 1989 now abandoned.

BACKGROUND OF THE INVENTION

1. Field of the Invention

The present invention relates to a process for forming a film by vapor deposition on a substrate. The invention also pertains to the use of such a film in a lithographic process.

2. Description of the Prior Art

In the field of semiconductor processing, it is generally known to use polysilane materials as positive photoresists. See, for example, U.S. Pat. No. 4,587,205, issued to Harrah, et al. on May 6, 1986, and U.S. Pat. No. 4,588,801, issued to Harrah, et al. on May 13, 1986. See also, West, R., "Polysilane High Polymers and Their Technological Applications," *Actual. Chim.*, (3), 64–70 (1986).

The art discloses a number of methods for the preparation of such polysilane compositions. For example, in U.S. Pat. No. 4,578,495, issued to Soula, et al. on Mar. 25, 1986, polysilanes are prepared by contacting, in an inert atmosphere, at least one disilane with a catalyst system which includes an ionic inorganic salt, $M^+A^-$, and a compound that complexes the $M^+$ cation of the salt. Reference is also made to U.S. Pat. No. 4,667,046, issued to Frey, et al. on May 19, 1987, which provides another method for making polysilanes. In that patent, the method involves reacting at least one methoxy-containing disilane with an SiH-containing silane in the presence of at least one alcoholate, MOR, where M is an alkali metal and R is a select monovalent hydrocarbon radical. Further, in U.S. Pat. No. 4,298,558, issued to Baney, et al. on Nov. 3, 1981, polysilane compositions are prepared by reacting, under anhydrous conditions, a select polysilane with a reagent selected from carbinols, alcoholates and alkyl orthoformates.

Yet another approach for preparing polysilanes is disclosed in U.S. Pat. No. 3,399,223, issued to Atwell, et al. on Aug. 27, 1968. That process involves heating under neutral conditions, at a temperature of 165°–350° C., a select polysilane to effect a redistribution between Si-Si bonds and Si-OR bonds.

In the use of polysilanes as photoresists, the procedure generally involves first preparing the desired polysilane, e.g. by one of the methods described above, and then dissolving it in a suitable solvent. After filtering the solution to remove impurities, the solution is spin applied to a substrate. This approach cannot be followed with many polysilanes, however, because they do not readily dissolve in commonly used solvents. Another drawback is that spin application does not result in a uniform coating of the material over horizontal and vertical surfaces on the substrate.

Efforts have been made to overcome the latter problem, so as to obtain a more uniform coating of photoresist, one technique involving the application of two or more layers. But this method further involves the use of two or more development steps, with a resulting increase in the complexity and cost of the overall process.

Another approach which attempts to obtain a more even coating thickness is disclosed in U.S. Pat. No. 4,675,273, issued to Woods, et al. on Jun. 23, 1987, where a photoresist is formed on a substrate by vapor deposition. However, in practice, the process first requires treating the substrate surface with a suitable activator. Also, the process involves the use of cyanoacrylate monomers; there is no disclosure that any other types of monomers could be satisfactorily employed. Reference is also made to U.S. Pat. No. 4,781,942, issued to Leyden, et al. on Nov. 1, 1988, where a protective layer of a siloxane polymer is deposited on the surface of a substrate. According to this process, a select monomer precursor is reacted with a select oxygen-containing precursor in the presence of radiation, resulting in formation of a siloxane polymer on a substrate.

Thus, there is a need in the art for a process for depositing a film of a polysilane material, which overcomes the disadvantages of spin application, which forms a more uniform coating over horizontal and vertical surfaces on a substrate, and which can be utilized for depositing a variety of polysilanes, not all of which are utilizable by way of spin application.

SUMMARY OF THE INVENTION

Now, in accordance with the invention, a new process has been discovered for forming a film comprising a polysilane composition on a substrate. In accordance with the invention, a substrate is exposed to the vapor of a polymerizable silane monomer under such conditions as to deposit on the substrate a film comprising a polysilane composition. In another aspect of the invention, the film is then exposed in a predetermined pattern to radiation, and the radiation exposed portions of the film are removed. This process is particularly useful in the production of semiconductor devices on silicon wafers.

It is a feature of the invention that a film useful as a positive-working photoresist is formed directly on a substrate, thus avoiding the cumbersome steps of first preparing the polymer, dissolving it in a solvent and purifying it. As an additional feature, it has been found that a film comprising a polysilane composition can be formed on the substrate, which is of relatively uniform thickness, over horizontal and vertical surfaces, as compared with that obtainable through the use of conventional spin application techniques. Still further, a wide variety of polysilane compositions can be deposited, which are not otherwise utilizable by spin application, since they are not readily dissolvable in solvents ordinarily used.

DETAILED DESCRIPTION

In accordance with the process of the invention, a substrate is exposed to the vapor of a polymerizable silane monomer. Preferred silane monomers include those having the formula

wherein R is H; $C_1$–$C_4$ alkyl, alkenyl, alkynyl, alkoxy or alkyl silyl; aryl; or amino; wherein R' is H; $C_1$–$C_4$ alkyl, alkenyl, alkynyl, alkoxy or alkyl silyl; aryl; amino; halo; or methyl halo; and wherein R" is H; $C_1$–$C_4$ alkyl, alkenyl, alkynyl, alkoxy or alkyl silyl; aryl; or amino.

A more preferred group of silane monomers for use according to the invention include those having the above formula wherein R is $C_1$–$C_3$ alkyl; R' is $C_1$–$C_4$ alkyl trimethyl silyl, aryl, fluoro or methyl fluoro; and R" is $C_1$-$C_3$ alkyl. In a particularly preferred embodiment of the invention, pentamethylmethoxydisilane is employed.

Typically, the substrate which is utilized is silicon dioxide coated silicon or silicon, although the process can be applied to other substrates if so desired.

In carrying out the process of the invention, the silane monomer is heated to a suitable temperature so as to produce sufficient concentration of vapor for polysilane deposition on the substrate. The general reaction for polysilane formation may be illustrated as follows:

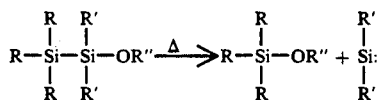

The diradical polymerizes to yield $[Si(R')_2]_n$, where n is an integer ranging from about 2–1,000, depending generally upon the nature of the starting material, the reaction conditions and so forth.

The actual reaction conditions, i.e. temperature, pressure and time, may vary over wide ranges and are generally dependent on the silane monomer and the exact equipment being employed, as well as other factors familiar to those skilled in the art. In general, however, temperatures ranging from about 200° to about 650° C. and pressures ranging from about 50 mtorr to about 100 torr for a period of about 1 to about 20 minutes are typical. Reaction temperatures from about 500° to about 600° C. and pressures from about 2 to about 5 torr are preferred.

The reaction may be carried out in the presence or absence of a solvent. In the latter case, the silane monomer (or mixture of monomers) serves as a solvent. When a solvent is employed, it must be selected so as to solubilize the silane monomer, be chemically inert with respect to the silane monomer, and so forth.

Various other materials may be added to the silane monomer prior to polymerization to change the properties of the resulting film. For example, cross-linkers, chain terminators to control molecular weight, other co-monomers to vary optical properties, etc. may be employed, as will be apparent to those skilled in the art.

The film formed in accordance with the invention will generally have a thickness from about 0.1 to about 1 μm, depending upon the nature of the monomer used, the reaction conditions, etc.

To form an image on the substrate, the film is then exposed in a predetermined pattern to radiation, such as UV or ionizing radiation sources, including X-ray, gamma ray and charged particle beams, e.g., electron beams. Either direct write or photomask techniques may be suitably used. Preferably, the film is exposed through a mask to deep UV radiation, most preferably with a wavelength in the range of about 240–260 nm. Following the exposure step, the portions of the film which were exposed to the radiation are removed. A conventional developer, such as isopropyl alcohol, can be used for this purpose. The removal of the exposed portions of the film results in a polymer film with the predetermined pattern on the substrate.

Thus, in accordance with the process of the present invention, there is provided a film of a polysilane composition, formed directly on a substrate in the vapor phase. The film is adherent and coats relatively uniformly over horizontal and vertical surfaces on the substrate; and it is effectively employed as a positive-working photoresist to form a desired image on the substrate.

The following example is provided to illustrate the invention.

EXAMPLE

A sample (1.5 ml) of pentamethylmethoxydisilane, obtained from Petrarch, Inc. (98% purity), was placed in a 20 ml glass ampule attached to a vacuum manifold. The manifold was composed of 3 parts: the reagent vessel, a quartz furnace tube, and a deposition chamber. The furnace tube was 25 cm in length and 2 cm in diameter. The deposition chamber was approximately 40 cm long and 15 cm in diameter. A silicon wafer was placed in the deposition chamber opposite the furnace tube. The furnace was heated to 600° C. and the reagent ampule was heated to 95° C. After evacuation of the apparatus, the valve to the vacuum pump was closed, and the reagent was introduced. The system pressure rose to several torr for a period of 1–2 min., and then dropped to less than 1 torr as the reaction progressed. Upon removal of the wafer from the deposition chamber, a circular film approximately 40 mm in diameter was observed. The film was thicker at the center, with the following measurements being taken:

| Radial Position (mm) | Film Thickness (Å) |
| --- | --- |
| 0 | 4311 |
| 3 | 4137 |
| 6 | 3501 |
| 15 | 1761 |
| 20 | 1081 |

UV spectroscopic characterization showed absorbance by the film at 200–270 nm, with very little absorbance above 300 nm. For this purpose, a sample was prepared by deposition on a quartz wafer.

Film samples were exposed on a proximity printer at 240–260 nm. A variable transmission mask was used to generate exposures of 0–240 mj/cm$^2$ on each wafer. The mask contained a series of equal line/space patterns between 1.0 and 2.0 μm. Expose values of 70–80 mj/cm$^2$ were optimum. Positive tone images were developed with a 30 sec. rinse with isopropyl alcohol.

What is claimed is:

1. A process for forming a film on a substrate, comprising exposing said substrate to the vapor of a polymerizable silane monomer in the substantial absence of oxygen and under such conditions as to deposit on said substrate a film which is photosensitive and comprises a polysilane composition having a chemical backbone characterized by sillicon-silicon bonding.

2. The process of claim 1, wherein said polymerizable silane monomer has the formula

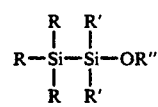

wherein:
R is H; $C_1$-$C_4$ alkyl, alkenyl, alkynyl, alkoxy or alkyl silyl; aryl; or amino;
R' is H; $C_1$-$C_4$ alkyl, alkenyl, alkynyl, alkoxy or alkyl silyl; aryl; amino; halo; or methyl halo; and
R" is H; $C_1$-$C_4$ alkyl, alkenyl, alkynyl, alkoxy or alkyl silyl; aryl; or amino.

3. The process of claim 2, wherein:
R is $C_1$-$C_3$ alkyl;
R' is $C_1$-$C_4$ alkyl, trimethyl silyl, aryl, fluoro or methyl fluoro; and
R" is $C_1$-$C_3$ alkyl.

4. The process of claim 3, wherein said polymerizable silane monomer is pentamethylmethoxydisilane.

5. The process of claim 1, wherein said substrate is silicon dioxide coated silicon or silicon.

6. A process for forming a film on a substrate, comprising exposing said substrate to the vapor of a polymerizable silane monomer under such conditions as to deposit on said substrate a film comprising a polysilane composition, wherein said polymerizable silane monomer is heated to a temperature ranging from about 300° to about 650° C. at a pressure ranging from about 50 mtorr to about 100 torr for a period of about 1 to about 20 minutes.

7. The process of claim 6, wherein said temperature ranges from about 500° to about 600° C. and said pressure ranges from about 2 to about 5 torr.

8. A process for forming an image on a substrate, said process comprising the steps of:
exposing said substrate to the vapor of a polymerizable silane monomer in the substantial absence of oxygen and under such conditions as to deposit on said substrate a film which is photosensitive and comprises a polysilane composition having a chemical backbone characterized by silicon-silicon bonding;
exposing said film in a predetermined pattern to radiation; and
removing the radiation exposed portions of said film.

9. The process of claim 8, wherein said polymerizable silane monomer has the formula

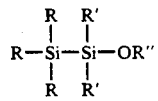

wherein:
R is H; $C_1$-$C_4$ alkyl, alkenyl, alkynyl, alkoxy or alkyl silyl; aryl; or amino;
R' is H; $C_1$-$C_4$ alkyl, alkenyl, alkynyl, alkoxy or alkyl silyl; aryl; amino; halo; or methyl halo; and
R" is H; $C_1$-$C_4$ alkyl, alkenyl, alkynyl, alkoxy or alkyl silyl; aryl; or amino.

10. The process of claim 9, wherein:
R is $C_1$-$C_3$ alkyl;
R' is $C_1$-$C_4$ alkyl, trimethyl silyl, aryl, fluoro or methyl fluoro; and
R" is $C_1$-$C_3$ alkyl.

11. The process of claim 10, wherein said polymerizable silane monomer is pentamethylmethoxydisilane.

12. The process of claim 8, wherein said substrate is silicon dioxide coated silicon or silicon.

13. A process for forming an image on a substrate, said process comprising the steps of:
exposing said substrate to the vapor of a polymerizable silane monomer under such conditions as to deposit on said substrate a film comprising a polysilane composition, wherein said polymerizable silane monomer is heated to a temperature ranging from about 200° to about 650° C. at a pressure ranging from about 50 mtorr to about 100 torr for a period of about 1 to about 20 minutes;
exposing said film in a predetermined pattern to radiation; and
removing the radiation exposed portions of said film.

14. The process of claim 13, wherein said temperature ranges from about 500° to about 600° C. and said pressure ranges from about 2 to about 5 torr.

15. A process for forming an image on a substrate, said method comprising the steps of:
exposing said substrate to the vapor of a polymerizable silane monomer, which is heated to a temperature ranging from about 500° to about 600° C. at a pressure ranging from about 2 to about 5 torr, in the substantial absence of oxygen, so as to deposit on said substrate a film which is photosensitive and comprises a polysilane composition, said polymerizable silane monomer having the formula

wherein:
R is H; $C_1$-$C_4$ alkyl, alkenyl, alkynyl, alkoxy or alkyl silyl; aryl; or amino;
R' is H; $C_1$-$C_4$ alkyl, alkenyl, alkynyl, alkoxy or alkyl silyl; aryl; amino; halo; or methyl halo; and
R" is H; $C_1$-$C_4$ alkyl, alkenyl, alkynyl, alkoxy or alkyl silyl; aryl; or amino;
exposing said film in a predetermined pattern to radiation; and
removing the radiation exposed portions of said film.

16. The process of claim 15, wherein:
R is $C_1$-$C_3$ alkyl;
R' is $C_1$-$C_4$ alkyl, trimethyl silyl, aryl, fluoro or methyl fluoro; and
R" is $C_1$-$C_3$ alkyl.

17. The process of claim 16, wherein said film is exposed to radiation having a wavelength ranging from about 240 to about 260 nanometers.

18. The process of claim 17, wherein said polymerizable silane monomer is pentamethylmethoxydisilane, and said substrate is silicon dioxide coated silicon or silicon.

* * * * *